United States Patent [19]
Ivanov

[11] Patent Number: 5,973,564
[45] Date of Patent: Oct. 26, 1999

[54] OPERATIONAL AMPLIFIER PUSH-PULL OUTPUT STAGE WITH LOW QUIESCENT CURRENT

[75] Inventor: Vadim V. Ivanov, Tucson, Ariz.

[73] Assignee: Burr-Brown Corporation, Tucson, Ariz.

[21] Appl. No.: 09/053,634

[22] Filed: Apr. 2, 1998

[51] Int. Cl.[6] .................................................. H03F 3/26
[52] U.S. Cl. ........................................... 330/271; 330/265
[58] Field of Search .................................... 330/271, 275, 330/270, 255, 251, 207 A, 265

[56] References Cited

U.S. PATENT DOCUMENTS

| | | | |
|---|---|---|---|
| 3,983,502 | 9/1976 | Wheatley, Jr. | 330/14 |
| 4,333,059 | 6/1982 | Yamaguchi et al. | 330/265 |
| 4,403,200 | 9/1983 | Davis | 330/294 |
| 4,521,737 | 6/1985 | Bynum | 330/257 |
| 4,521,740 | 6/1985 | Nakayama | 330/267 |
| 4,538,116 | 8/1985 | Vyne | 330/271 |
| 4,833,423 | 5/1989 | Molloy | 330/265 |
| 4,853,645 | 8/1989 | Seevinck et al. | 330/255 |
| 4,857,861 | 8/1989 | Seevinck et al. | 330/255 |
| 4,959,623 | 9/1990 | Khoury | 330/265 |
| 4,990,863 | 2/1991 | Susak et al. | 330/265 |
| 5,229,721 | 7/1993 | Stade | 330/265 |
| 5,467,058 | 11/1995 | Fujita | 330/267 |
| 5,592,124 | 1/1997 | Mullins et al. | 330/308 |

OTHER PUBLICATIONS

A 1–GHz Bipolar Class–AB Operational Amplifier with Multipath Nested Miller Compensation for 76–dB Gain, by Klaas–Jan de Langen et al., IEEE Journal of Solid State Circuits, Vol. 32, No. 4, Apr., 1997, pp. 488–498.

*Primary Examiner*—Benny Lee
*Assistant Examiner*—Henry Choe
*Attorney, Agent, or Firm*—Cahill, Sutton & Thomas P.L.C.

[57] ABSTRACT

An operational amplifier output circuit having a low, stable quiescent current includes an input stage (22) receiving an input voltage ($v_{in}$") and producing first ($v_1$) and second ($v_2$) signals. An output stage (23) includes a pull-up transistor (1) and a pull-down transistor (2), a base of the pull-up transistor (1) receiving the first signal ($v_1$). An emitter of the pull-up transistor (1) is coupled by an output conductor (30) to a collector of the pull-down transistor (2). A base of the pull-down transistor is coupled to receive the second signal ($v_2$), and an emitter of the pull-down transistor (2) is coupled to a second reference voltage conductor (GND). A feedback stage (24) includes a first sensing circuit (36) coupled to the pull-up transistor 1 and produces a third signal ($v_3$) representing a collector current of the pull-up transistor (1), a second sensing circuit (37) coupled to the pull-down transistor (2) and producing a fourth signal ($v_4$) representing a collector current of the pull-down transistor (2), a combining circuit (38) receiving the third ($v_3$) and fourth ($v_4$) signals to produce an error signal ($v_5$) representing the larger of the third ($v_3$) and fourth ($v_4$) signals, and an error amplifier (17) receiving the error signal ($v_5$) to produce a feedback signal ($v_6$) regulating the first ($v_1$) and second ($v_2$) signals to establish a stable quiescent current in the pull-up transistor (1) or the pull-down transistor (2).

19 Claims, 2 Drawing Sheets

5,973,564

OPERATIONAL AMPLIFIER PUSH-PULL OUTPUT STAGE WITH LOW QUIESCENT CURRENT

BACKGROUND OF THE INVENTION

Since lateral PNP transistors in conventional bipolar integrated circuit manufacturing processes have very limited speed and current capabilities, it is a common practice to provide wideband micropower operational amplifiers with output stages having only NPN transistors in the main signal path. See, for example, U.S. Pat. No. 4,403,200 and the paper "A 1-GHz Bipolar Class-AB Operational Amplifier with Multipath Nested Miller Compensation for 76-dB Gain", by Klaas-Jan de Langen et al., IEEE Journal of Solid-State Circuits, Vol. 32, No. 4, April, 1997. U.S. Pat. No. 4,403,200 discloses an NPN output stage in which a current source 30 must be large enough to allow pull-up transistor 24 to supply the largest possible expected load current. Consequently, the quiescent current is very large, and the power dissipation of the output stage is higher than desirable.

This is one main drawback of existing solutions involving use of only NPN transistors in the main signal path. Another drawback is that attempts to supply the largest expected load current by using Darlington transistors to increase the current gain results in unacceptably large saturation voltages of the pull-down transistors of the output stage. This technique therefore is not useful in low voltage and micropower operational amplifiers. In the closest prior art micropower operational amplifier, the maximum ratio of the peak output current to the quiescent current is limited to approximately 50. Furthermore, it is desirable that the quiescent current (i.e., the current with the input signal equal to zero volts) of a micropower amplifier be stable so that variations in the quiescent current do not produce non-linearities in the output signal and that the operational amplifier be capable of driving a large capacitive load.

FIG. 1 of U.S. Pat. No. 4,853,645 by Seevinick et al., entitled "AMPLIFIER ARRANGEMENT WITH QUIESCENT CURRENT CONTROL", discloses an amplifier arrangement wherein the first output transistor $T_1$ and a second output transistor $T_2$ are push-pull transistors driven by a drive circuit 10 having two transistors $T_{11}$ and $T_{12}$ which have current sources $T_{13}$ and $T_{14}$ respectively, as load devices. Currents which are a measure of the currents flowing through the first output transistor $T_1$ and the second output transistor $T_2$ are generated by a first current measuring circuit 20 and a second current measuring circuit 30. These currents are applied to a negative feedback circuit 40 which controls the intensity of the current sources $T_{13}$ and $T_{14}$ in such a way that the harmonic mean value of the currents flowing through the first output transistor $T_1$ and the second output transistor $T_2$ is substantially equal to a reference value. A drawback of this circuit is that it has a large quiescent current. Also, the constant current source I4 in FIG. 1 of the Seevinick et al. patent must be large enough to supply all of the base current ever needed by the pull-up transistor T1 and the pull-down transistor T2 during any transient. For this reason alone is the Seevinick et al. circuit not suitable for very low power applications. Also, the maximum output voltage is approximately 2.5 $V_{BE}$ voltage drops lower than the positive supply voltage, undesirably limiting the output voltage range.

There is an unmet need for a very low power, wideband operational amplifier push-pull output stage with a lower, more stable quiescent current than has previously been achieved.

SUMMARY OF THE INVENTION

Accordingly, it is an object of the invention to provide a high speed amplifier output stage which has a low, stable quiescent bias current.

It is another object of the invention to provide a wideband micropower operational amplifier that avoids problems that would be caused by instability of its quiescent current.

It is another object of the invention to provide an operational wideband low power amplifier having the combined properties of high speed, low, stable bias current, and high load current driving/sinking capability.

Briefly described, and in accordance with one embodiment thereof, the invention provides an output circuit including an input stage (22) receiving an input voltage ($v_m$") and producing first ($v_1$) and second ($v_2$) signals in response to the input voltage and an output stage (23) including a pull-up transistor (1) and a pull-down transistor (2), a base of the pull-up transistor (1) being coupled to receive the first signal $v_1$, an emitter of the pull-up transistor (1) being coupled by an output conductor (30) to a collector of the pull-down transistor (2), a base of the pull-down transistor being coupled to receive the second signal $v_2$, and an emitter of the pull-down transistor (2) being coupled to a second reference voltage conductor (GND). A feedback stage (24) includes a first sensing circuit (36) coupled to the pull-up transistor 1 and producing a first signal ($v_3$) representing a collector current ($I_{C1}$) of the pull-up transistor (1). A second sensing circuit (37) is coupled to the pull-down transistor (2) and produces a second signal ($v_4$) representing a collector current ($I_{C2}$) of the pull-down transistor (2). A combining circuit (38) receives the first ($v_3$) and second ($v_4$) signals to produce an error signal ($v_5$) representing the larger of the first ($v_3$) and second ($v_4$) signals. An error amplifier (17) receives the error signal ($v_5$) to produce a feedback signal ($v_6$) regulating the first ($v_1$) and second ($v_2$) signals to establish a stable quiescent current in the one of the pull-up transistor (1) and the pull-down transistor (2) having the lowest collector current.

In the described embodiment, the input stage (22) includes a first NPN transistor (16), a PNP current source transistor (15), and a first constant current source (18). The PNP current source transistor (15) has an emitter coupled to a first supply voltage conductor ($V_{CC}$) and a collector coupled by a first conductor (26) to a collector of the first NPN transistor (16). A base of the first NPN transistor (16) receives an input voltage ($v_{in}$"). The first constant current source (18) is coupled by a second conductor (25) to an emitter of the first NPN transistor. The pull-up transistor and the pull-down transistor are NPN transistors. An inverting input of the error amplifier (17) receives the error signal ($v_5$) and a non-inverting input of the error amplifier receives a reference voltage ($V_{ref}$) so the error amplifier (17) stabilizes the quiescent current to a value determined by the reference voltage ($V_{ref}$). The first sensing circuit (36) includes a fourth NPN transistor (3) having a base coupled to the first conductor (26), a first resistor (R5) coupled between the output conductor (30) and an emitter of the fourth NPN transistor (3), and a second resistor (R7) coupled between the first reference voltage conductor ($V_{CC}$) and a collector of the fourth NPN transistor (3), a fourth conductor (27) coupling the first signal ($v_3$) from the collector of the fourth NPN transistor (3) to the base of the second NPN transistor (9). The second sensing circuit (36) includes a fifth NPN transistor (4) having a base coupled to the second conductor (25), a third resistor (R6) coupled between the output conductor (30) and the second reference voltage conductor (GND), and a fourth resistor (R8) coupled between the first reference voltage conductor ($V_{CC}$) and a collector of the fifth NPN transistor (4), a fifth conductor (28) coupling the second signal ($v_4$) from the collector of the fifth NPN transistor (4) to the base of the third NPN transistor (10).

The combining circuit (38) includes second (9) and third (10) NPN transistors having their emitters coupled to a third conductor (29) conducting the wire ORing signal ($v_5$), a base of the second NPN transistor (9) receiving the first signal ($v_3$), a base of the third NPN transistor (10) receiving the second signal ($v_4$).

DETAILED DESCRIPTION OF THE PREFERRED EMBODIMENTS

Figure 1:
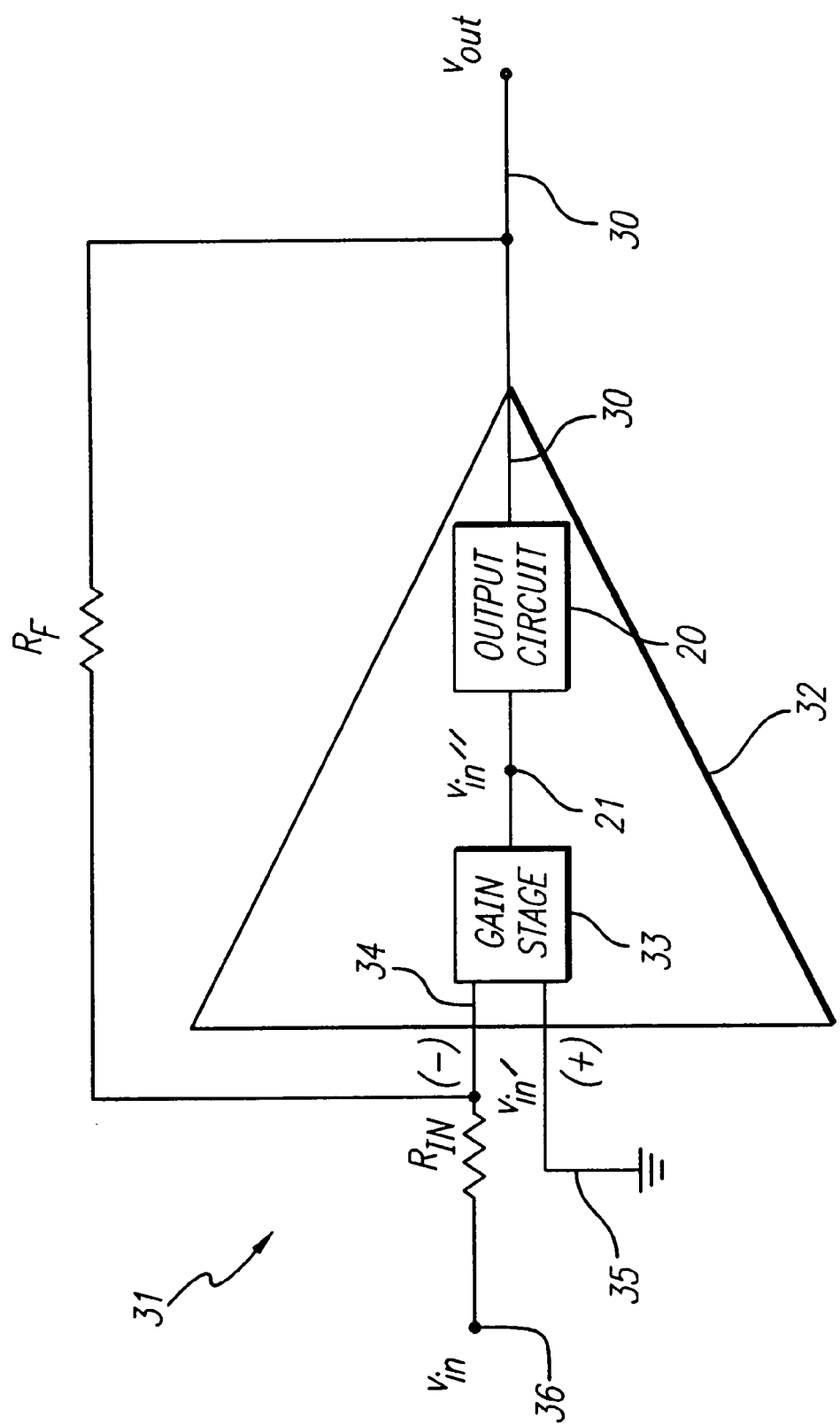
FIG. 1 is a block diagram of an operational amplifier circuit that includes the output circuit of FIG. 2.

Referring to FIG. 1, operational amplifier circuit 31 includes an operational amplifier 32 having a non-inverting input 35 connected to ground and an inverting input 34 coupled by an input resistor $R_{IN}$ to an input conductor 36 to which an input signal $v_{in}$ is applied. Conductor 34 also is coupled by a feedback resistor $R_F$ to an output conductor 30 on which an output voltage $v_{out}$ is produced. The voltage on conductor 34 is designated as $v_{in}'$. Operational amplifier 32 includes a conventional gain stage 33 having inverting and non-inverting inputs coupled to conductors 34 and 35, respectively. Gain stage 33 produces an amplified intermediate signal $v_{in}''$ on conductor 21, which is applied as an input to output circuit 20. Output circuit 20 produces the output voltage $v_{out}$ on conductor 30. In accordance with the present invention, output circuit 20, shown in FIG. 2, has a very low, stable quiescent bias circuit.

Figure 2:
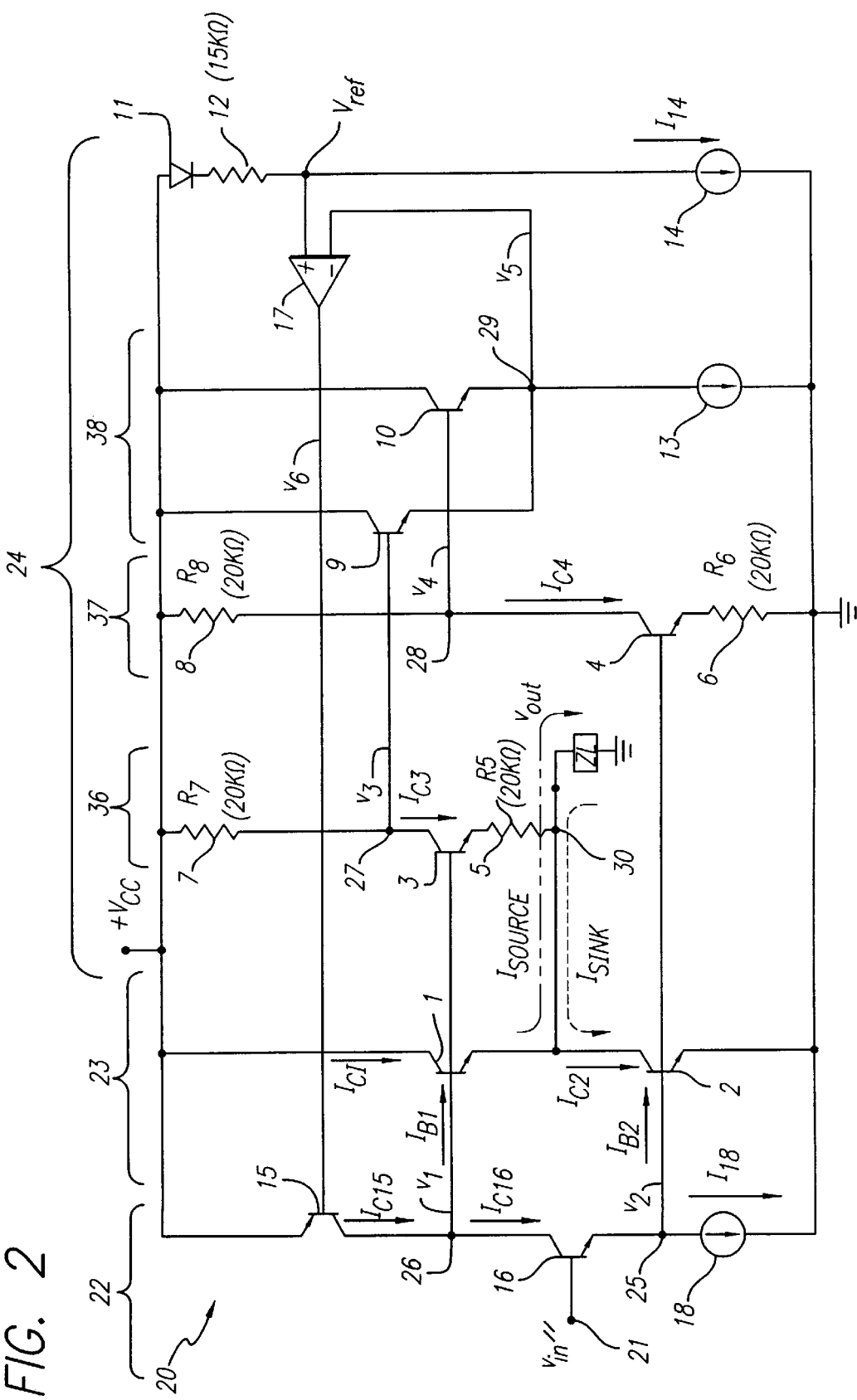
FIG. 2 is a schematic diagram of a preferred embodiment of the output circuit of the present invention.

Referring to FIG. 2, output circuit 20 is suitable for use in a wide band micropower operational amplifier, and includes an input stage 22, an output stage 23, and a feedback circuit 24. (Those skilled in the art usually understand the term "micropower operational amplifier" to mean one that draws less than 100 microamperes of current from the power supply under quiescent conditions; however, in some cases the same term is used to refer to operational amplifiers which draw less than 20 microamperes.)

Input stage 22 includes an NPN transistor 16 having its base coupled to voltage $v_{in}''$ and its emitter coupled by conductor 25 to a constant current source 18 which produces a constant current $I_{18}$. The collector of transistor 16 is connected by conductor 26 to the collector of a PNP current source transistor 15, the emitter of which is connected to $+V_{CC}$. Input stage 26 produces a voltage $v_1$ on conductor 26 and a voltage $V_2$ on conductor 25.

Output stage 23 includes an NPN pull-up transistor 1 and NPN pull-down transistor 2. The base and collector of pull-up transistor 1 are connected to conductor 26 and $+V_{CC}$, respectively. The emitter of pull-up transistor 1 is connected to output conductor 30. The base, emitter, and collector of pull-down transistor 2 are connected to conductor 25, ground, and output conductor 30, respectively. Output voltage $v_{out}$ is produced on output conductor 30. A low-impedance load $Z_L$ may be connected to output conductor 30, in which case pull-up transistor 1 may have to "source" a large output current $I_{source}$ to $Z_L$ or pull-down transistor 2 may have to "sink" a typically much larger output current $I_{SINK}$ from $Z_L$.

Feedback circuit 24 operates to stabilize the quiescent current (i.e., the no-load current) through pull-up transistor 1 and pull-down transistor 2. Feedback circuit 24 includes a first sensing circuit 36 and a second sensing circuit 37. First sensing circuit 36 includes NPN transistor 3 and resistors R5 and R7. Resistor R7, which may have a resistance of 20 kilohms, is connected between $+V_{CC}$ and conductor 27. The collector and base of NPN transistor 3 are connected to conductors 27 and 26, respectively. Resistor R5 is connected between the emitter of transistor 3 and output conductor 30. Resistor R5 also may have a resistance of 20 kilohms. First sensing circuit 36 "measures" the collector current $I_{C1}$ of pull-up transistor 1 and produces a voltage drop across resistor R7 that is proportional to the collector current $I_{C1}$ through pull-up transistor 1. That causes the voltage $v_3$ on conductor 27 to vary in the opposite sense to the collector current $I_{C1}$. Second sensing circuit 37 includes NPN transistor 4 and resistors R6 and R8, both of which may be 20 kilohms. Resistor R8 is connected between $+V_{CC}$ and conductor 28. The base and collector of transistor 4 are connected to conductors 28 and 25, respectively. Resistor R6 is connected between ground and the emitter of transistor 4. Second sensing circuit 37 measures the collector current $I_{C2}$ of pull-down transistor 2 and produces a voltage drop across resistor R8 that is inversely proportional to the collector current $I_{C2}$ through pull-down transistor 2. That causes the voltage $v_4$ on conductor 28 to vary in the opposite sense to the collector current $I_{C2}$. The voltages $v_3$ and $v_4$ are applied to the bases of NPN transistors 9 and 10, respectively.

Transistors 9 and 10 have their emitters connected by conductor 29 to a constant current source 13 to apply a voltage $v_5$ to the (−) input of an error amplifier 17. Their collectors are connected to $+V_{CC}$. $v_5$ is equal to one $V_{BE}$ voltage less than the higher of $v_3$ and $v_4$. Transistors 9 and 10 and constant current source 13 can be thought of as being a level shifting wired OR circuit 38.

The (+) input of error amplifier 17 is connected to a constant reference voltage $V_{ref}$ produced by a reference circuit including diode 11, 15 kilohm resistor 12, and constant current source 14. The output $v_6$ of error amplifier 17 is connected to the base of PNP transistor 15.

The reference voltage $V_{ref}$ applied to the (+) input of differential amplifier 17 and the voltage $v_5$ are established so that PNP current source transistor 15 can supply both (1) the constant current $I_{18}$ required by constant current source 18, plus (2) as much base current $I_{B1}$ as is required by the base of pull-up transistor 1, and (3) as much current $I_{B2}$ into the base of pull-down transistor 2 as is needed so that pull-up transistor 1 and pull-down transistor 2 can supply current $I_{SOURCE}$ to a low-impedance load $Z_L$ (FIG. 1) that may be connected to conductor 30 or to sink a typically much larger current $I_{SINK}$ from load $Z_L$.

Under no-load conditions, values of the constant current source 18, the values of resistors R5, R6, R7 and R8 and the value of the reference voltage $V_{ref}$ are chosen so that a desired quiescent value of collector currents $I_{C1}$ and $I_{C2}$ flow through pull-up transistor 1 and pull-down transistor 2, respectively.

Then, if a load current $I_{SOURCE}$ is supplied to $Z_L$ or a load current $I_{SINK}$ is sunk from $Z_L$ through conductor 30, the necessary increase in base current of pull-up transistor 1 or pull-down transistor 2 is automatically supplied by PNP current source transistor 15. That is because either $v_3$ or $v_4$ increases according to the difference between the amount of collector current $I_{C15}$ being delivered by PNP current source transistor 15 to constant current source 18 and the amount of base current $I_{B1}$ or $I_{B2}$ that is required to produce $I_{SOURCE}$ or $I_{SINK}$. This increases $v_5$, resulting in a corresponding reduction of $v_6$, which turns PNP transistor 15 on harder so it supplies the additional base current $I_{B1}$ or $I_{B2}$ needed by pull-up transistor 1 or pull-down transistor 2.

To understand how first sense circuit 36 produces $v_3$ so that it varies in the sense opposite to $I_{C1}$ it should be understood that if the emitter areas of pull-up transistor 1 and pull-down transistor 2 are equal, then the voltage drop across resistor R5 for low values of $I_{SOURCE}$ is negligible in its effect on the value of the collector circuit $I_{C3}$ in transistor 3, because the $V_{BE}$ voltage of transistor 3 is nearly equal to that of pull-up transistor 1. That is, for small currents, $I_{C1} \approx C_{C3}$, and similarly, $I_{C2} \approx I_{C4}$. It also is helpful to understand that usually $I_{SINK}$ will be much greater than $I_{SOURCE}$. Therefore, the voltage drop across resistor R5, and hence across resistor R7, which for small current is proportional to $I_{C1}$, will be much smaller than the voltage drop across resistor R6. Consequently, the voltage drop across resistor R7 (which is equal to that across R5) also will be much smaller than the voltage drop across resistor R8 (which is equal to that across R6). Therefore, $v_3$ usually will be higher than $v_4$. Therefore, transistor 10 will be off, and $v_5$ will be one $V_{BE}$ drop lower than $v_3$.

The feedback loop through error amplifier 17 and PNP current source transistor 15 therefore usually stabilizes $I_{C1}$ (rather than $I_{C2}$) to a value that is the desired stable quiescent circuit. For the above-indicated exemplary resistance values, and with constant current $I_{14}$ equal to 6 microamperes, the stabilized value of $I_{C1}$, and hence the stabilized quiescent current of output stage 23, is approximately 6 microamperes. If $I_{SOURCE}$ happens to be greater than $I_{SINK}$, then the $v_4$ will be greater than $v_3$, and the feedback loop then stabilizes $I_{C2}$ (instead of $I_{C1}$) to approximately 6 microamperes. The value of $V_{ref}$ determines the value of stabilized quiescent current. The ratio of R7 to R5 (and the ratio of R8 to R6) determines the gain of the feedback loop.

Under "quiescent" conditions, the values of resistors R5, R6, R7 and R8 and the value of $V_{ref}$ determine the quiescent values of $I_{C1}$ and $I_{C2}$. The design of FIG. 1 allows these quiescent values of $I_{C1}$ and $I_{C2}$, the constant current $I_{18}$ and the constant currents supplied by constant current sources 13 and 14 all to be quite small, because none of these constant values has to be large to allow pull-up transistor 1 or pull-down transistor 2 to source or sink a large load current. Instead, when a large output current is needed, the feedback circuit 24 automatically increases the amount of current delivered by PNP current source transistor 15. The above-identified values of R5, R6, R7 and R8, with $V_{CC}$ equal to +5 volts, result in a quiescent current of approximately 6 microamperes through transistors 1 and 2.

The above described invention provides a very low, stable quiescent current in the all-NPN output stage of an operational amplifier, and therefore allows the manufacture of a very wide band (e.g., 400 kHz, which is roughly twice what has been achieved to date for micropower operational amplifiers, even those manufactured using much more complex integrated circuit manufacturing processes than the one used to implement the present invention). The value of the quiescent current can be readily designed to provide the needed linearity for a particular capacitive load. In the circuit shown in FIG. 2, the output current of amplifier 17 is multiplied by the current gain β of PNP current source transistor 15 and also by the β of whichever of transistors 1 and 2 is supplying an output current. This results in a much higher ratio of the maximum output current magnitude and the quiescent current through transistor 1 or transistor 2 than has been achieved by the prior art.

The same configuration shown in FIG. 2 can be implemented using N-channel MOSFETs with source, gate and drains electrodes connected the same or similarly to the emitter, base, and collector electrodes of the NPN transistors in FIG. 2, and using a P-channel MOSFET with its source, gate, and drain electrode connected the same or similarly to the emitter, base, and collector of PNP transistor 15.

While the invention has been described with reference to several particular embodiments thereof, those skilled in the art will be able to make the various modifications to the described embodiments of the invention without departing from the true spirit and scope of the invention. It is intended that all elements or steps which are insubstantially different or perform substantially the same function in substantially the same way to achieve the same result as what is claimed are within the scope of the invention. For example, in FIG. 2 a differential input stage could be used instead of the illustrated single-ended input stage including transistors 15 and 16 and circuit source 18. A differential input stage would be used including two input NPN transistors similar to transistor 16 with their emitter coupled to a constant current source such as 18. Two PNP current source transistors such as 15 could be used as loads for the two NPN input transistors. The collector of the two NPN input transistors could be coupled to the bases of transistors 1 and 2, respectively. A differential input signal could be applied between the bases of the two NPN input transistors.

What is claimed is:

1. An output circuit comprising:
   (a) an input stage receiving an input voltage and producing first and second signals in response to the input voltage;
   (b) an output stage including an NPN pull-up transistor and an NPN pull-down transistor, a base of the NPN pull-up transistor being coupled to receive the first signal, an emitter of the NPN pull-up transistor being coupled by an output conductor to a collector of the NPN pull-down transistor, a base of the NPN pull-down transistor being coupled to receive the second signal, and an emitter of the NPN pull-down transistor being coupled to a reference voltage conductor;
   (c) a feedback stage including a first sensing circuit coupled to the NPN pull-up transistor and producing a third signal representing a collector current of the NPN pull-up transistor, a second sensing circuit coupled to the NPN pull-down transistor and producing a fourth signal representing a collector current of the NPN pull-down transistor, a combining circuit receiving the third and fourth signals to produce an error signal representing the larger of the third and fourth signals, and an error amplifier receiving the error signal to produce a feedback signal regulating the first and second signals to establish a stable quiescent current in the one of the pull-up transistor and the NPN pull-down transistor having the lowest collector current.

2. An output circuit comprising:
   (a) an input stage including a first NPN transistor, a PNP current source transistor, and a first constant current source, the PNP current source transistor having an emitter coupled to a first supply voltage conductor and a collector coupled by a first conductor to a collector of the first NPN transistor, a base of the first NPN transistor receiving an input voltage, the first constant current source being coupled by a second conductor to an emitter of the first NPN transistor;
   (b) an output stage including an NPN pull-up transistor and an NPN pull-down transistor, a base of the NPN pull-up transistor being coupled to the first conductor, an emitter of the NPN pull-up transistor being coupled by an output conductor to a collector of the NPN pull-down transistor, a base of the NPN pull-down transistor being coupled to the second conductor, and an emitter of the NPN pull-down transistor being coupled to a second reference voltage conductor;

(c) a feedback stage including a first sensing circuit coupled to the first conductor and the output conductor and producing a first signal representing a collector current of the NPN pull-up transistor, a second sensing circuit coupled to the second conductor and the second reference voltage conductor and producing a second signal representing a collector current of the NPN pull-down transistor, a wire ORing circuit receiving the first and second signals to produce a wire ORed error signal representing the larger of the first and second signals, and an error amplifier receiving the wire ORed error signal to produce a feedback signal controlling a base of the PNP current source transistor to establish a stable quiescent current in the one of the NPN pull-up transistor and the NPN pull-down transistor having the lowest collector current.

3. The output circuit of claim 2 wherein an output of the error amplifier is connected to the base of the PNP current source transistor.

4. The output circuit of claim 2 wherein an inverting input of the error amplifier receives the wire ORed error signal and a non-inverting input of the error amplifier receives a reference voltage, the feedback signal stabilizing the quiescent current to a value determined by the reference voltage.

5. The output circuit of claim 4 wherein the wire ORing circuit includes second and third NPN transistors having their emitters coupled to a third conductor conducting the wire ORed error signal, a base of the second NPN transistor receiving the first signal, a base of the third NPN transistor receiving the second signal.

6. The output circuit of claim 5 wherein
(a) the first sensing circuit includes a fourth NPN transistor having a base coupled to the first conductor, a first resistor coupled between the output conductor and an emitter of the fourth NPN transistor, and a second resistor coupled between the first reference voltage conductor and a collector of the fourth NPN transistor, a fourth conductor coupling the first signal from the collector of the fourth NPN transistor to the base of the second NPN transistor; and
(b) the second sensing circuit includes a fifth NPN transistor having a base coupled to the second conductor, a third resistor coupled between the output conductor and the second reference voltage conductor, and a fourth resistor coupled between the first reference voltage conductor and a collector of the fifth NPN transistor, a fifth conductor coupling the second signal from the collector of the fifth NPN transistor to the base of the third NPN transistor.

7. The output circuit of claim 4 including a reference circuit including a reference resistor coupled between the non-inverting input of the error amplifier and the first reference voltage conductor, and a second constant current source coupled between the non-inverting input of the error amplifier and the second reference voltage conductor.

8. The output circuit of claim 5 wherein the wire Oring circuit includes a second constant current source coupled between the second supply voltage conductor and the third conductor.

9. A method of establishing a stable quiescent current in a push-pull output circuit including an output stage including an NPN pull-up transistor and an NPN pull-down transistor, an emitter of the NPN pull-up transistor being coupled by an output conductor to a collector of the NPN pull-down transistor, and an emitter of the NPN pull-down transistor being coupled to a reference voltage conductor, the method comprising the steps of:

(a) applying first and second signals to bases of the NPN pull-up transistor and the NPN pull-down transistor, respectively;
(b) sensing a collector current in the NPN pull-up transistor and in response thereto producing a first signal representing the collector current of the pull-up transistor, and sensing a collector current in the NPN pull-down transistor and in response thereto producing a second signal representing the collector current of the NPN pull-down transistor;
(c) producing an error signal representing the larger of the first and second signals;
(d) amplifying a difference between the error signal and a reference signal to produce a feedback signal; and
(e) regulating the first and second signals in response to the feedback signal to establish a stable quiescent current in the one of the pull-up transistor and the NPN pull-down transistor having the lowest collector current.

10. An operational amplifier comprising:
(a) a gain stage having an inverting input for receiving an input signal and a non-inverting input, and an output producing an intermediate signal;
(b) an output circuit including:
   i. an input stage receiving an input voltage and producing first and second signals in response to the input voltage;
   ii. an output stage including an NPN pull-up transistor and an NPN pull-down transistor, a base of the NPN pull-up transistor being coupled to receive the first signal, an emitter of the NPN pull-up transistor being coupled by an output conductor to a collector of the NPN pull-down transistor, a base of the NPN pull-down transistor being coupled to receive the second signal, and an emitter of the NPN pull-down transistor being coupled to a second reference voltage conductor;
   iii. a feedback stage including a first sensing circuit coupled to the NPN pull-up transistor and producing a third signal representing a collector current of the NPN pull-up transistor, a second sensing circuit coupled to the NPN pull-down transistor and producing a fourth signal representing a collector current of the NPN pull-down transistor, a combining circuit receiving the third and fourth signals to produce an error signal representing the larger of the third and fourth signals, and an error amplifier receiving the error signal to produce a feedback signal regulating the first and second signals to establish a stable quiescent current in the one of the pull-up transistor and the NPN pull-down transistor having the lowest collector current.

11. An operational amplifier comprising:
(a) a gain stage having an inverting input for receiving an input signal and a non-inverting input, and an output producing an intermediate signal;
(b) an output stage including
   i. an input stage including a first NPN transistor, a PNP current source transistor, and a first constant current source, the PNP current source transistor having an emitter coupled to a first supply voltage conductor and a collector coupled by a first conductor to a collector of the first NPN transistor, a base of the first NPN transistor receiving an input voltage, the first constant current source being coupled by a second conductor to an emitter of the first NPN transistor;

ii. an output stage including an NPN pull-up transistor and an NPN pull-down transistor, a base of the NPN pull-up transistor being coupled to the first conductor, an emitter of the NPN pull-up transistor being coupled by an output conductor to a collector of the NPN pull-down transistor, a base of the NPN pull-down transistor being coupled to the second conductor, and an emitter of the NPN pull-down transistor being coupled to a second reference voltage conductor;

iii. a feedback stage including a first sensing circuit coupled to the first conductor and the output conductor and producing a first signal representing a collector current of the NPN pull-up transistor, a second sensing circuit coupled to the second conductor and the second reference voltage conductor and producing a second signal representing a collector current of the NPN pull-down transistor, a wire ORing circuit receiving the first and second signals to produce a wire ORed error signal representing the larger of the first and second signals, and an error amplifier receiving the wire ORed error signal to produce a feedback signal controlling a base of the PNP current source transistor to establish a stable quiescent current in the one of the NPN pull-up transistor and the NPN pull-down transistor having the lowest collector current.

12. The operational amplifier of claim 11 wherein an output of the error amplifier is connected to the base of the PNP current source transistor.

13. The operational amplifier of claim 11 wherein an inverting input of the error amplifier receives the wire ORed error signal and a non-inverting input of the error amplifier receives a reference voltage, the feedback signal stabilizing the quiescent current to a value determined by the reference voltage.

14. The operational amplifier of claim 13 wherein the wire ORing circuit includes second and third NPN transistors having their emitters coupled to a third conductor conducting the wire ORed error signal, a base of the second NPN transistor receiving the first signal, a base of the third NPN transistor receiving the second signal.

15. The operational amplifier of claim 14 wherein
   (a) the first sensing circuit includes a fourth NPN transistor having a base coupled to the first conductor, a first resistor coupled between the output conductor and an emitter of the fourth NPN transistor, and a second resistor coupled between the first reference voltage conductor and a collector of the fourth NPN transistor, a fourth conductor coupling the first signal from the collector of the fourth NPN transistor to the base of the second NPN transistor; and
   (b) the second sensing circuit includes a fifth NPN transistor having a base coupled to the second conductor, a third resistor coupled between the output conductor and the second reference voltage conductor, and a fourth resistor coupled between the first reference voltage conductor and a collector of the fifth NPN transistor, a fifth conductor coupling the second signal from the collector of the fifth NPN transistor to the base of the third NPN transistor.

16. The operational amplifier of claim 13 including a reference circuit including a reference resistor coupled between the non-inverting input of the error amplifier and the first reference voltage conductor, and a second constant current source coupled between the non-inverting input of the error amplifier and the second reference voltage conductor.

17. The operational amplifier of claim 11 including a feedback circuit coupled between the output and the inverting input of the operational amplifier to maintain the output voltage at a level corresponding to the input signal despite variations in an output current.

18. A method of establishing a stable quiescent current in a push-pull output circuit of an operational amplifier, the output circuit including an output stage including an NPN pull-up transistor and an NPN pull-down transistor, an emitter of the NPN pull-up transistor being coupled by an output conductor to a collector of the NPN pull-down transistor, and an emitter of the NPN pull-down transistor being coupled to a reference voltage conductor, the method comprising the steps of:
   (a) applying first and second signals to bases of the NPN pull-up transistor and the NPN pull-down transistor, respectively;
   (b) sensing a collector current in the NPN pull-up transistor and in response thereto producing a first signal representing the collector current of the pull-up transistor, and sensing a collector current in the NPN pull-down transistor and in response thereto producing a second signal representing the collector current of the NPN pull-down transistor;
   (c) producing an error signal representing the larger of the first and second signals;
   (d) amplifying a difference between the error signal and a reference signal to produce a feedback signal; and
   (e) regulating the first and second signals in response to the feedback signal to establish a stable quiescent current in the one of the pull-up transistor and the NPN pull-down transistor having the lowest collector current.

19. An output circuit comprising:
   (a) an input stage receiving an input voltage and producing first and second signals in response to the input voltage;
   (b) an output stage including a pull-up transistor and a pull-down transistor, a control electrode of the pull-up transistor being coupled to receive the first signal, an first electrode of the pull-up transistor being coupled by an output conductor to a second electrode of the pull-down transistor, a control electrode of the pull-down transistor being coupled to receive the second signal, and a first electrode of the pull-down transistor being coupled to a second reference voltage conductor;
   (c) a feedback stage including a first sensing circuit coupled to the pull-up transistor 1 and producing a third signal representing a second electrode current of the pull-up transistor, a second sensing circuit coupled to the pull-down transistor and producing a fourth signal representing a second electrode current of the pull-down transistor, a combining circuit receiving the third and fourth signals to produce an error signal representing the larger of the third and fourth signals, and an error amplifier receiving the error signal to produce a feedback signal regulating the first and second signals to establish a stable quiescent current in the one of the pull-up transistor and the pull-down transistor having the lowest second electrode current.

* * * * *